United States Patent [19]

Sakurada

[11] Patent Number: 5,590,088
[45] Date of Patent: Dec. 31, 1996

[54] SEMICONDUCTOR MEMORY DEVICE WITH ENABLE SIGNAL CONVERSION CIRCUIT OPERATIVE FOR REDUCING CURRENT CONSUMPTION

[75] Inventor: Noriaki Sakurada, Suwa, Japan

[73] Assignee: Seiko Epson Corporation, Tokyo, Japan

[21] Appl. No.: 403,691

[22] PCT Filed: Jul. 7, 1994

[86] PCT No.: PCT/JP94/01119

§ 371 Date: Mar. 13, 1995

§ 102(e) Date: Mar. 13, 1995

[87] PCT Pub. No.: WO95/02885

PCT Pub. Date: Jan. 26, 1995

[30] Foreign Application Priority Data

Jul. 13, 1993 [JP] Japan .................................. 5-173229

[51] Int. Cl.⁶ .................................................. G11C 8/00
[52] U.S. Cl. ............................................. 365/233; 365/194
[58] Field of Search .............................. 365/233, 233.5, 365/191, 194, 189.12, 195

[56] References Cited

U.S. PATENT DOCUMENTS

| | | | |
|---|---|---|---|
| 4,829,485 | 5/1989 | Hatanaka | 365/233 X |
| 4,893,282 | 1/1990 | Wada | 365/233.5 |
| 4,918,657 | 4/1990 | Takahashi | 365/233 X |
| 5,083,296 | 1/1992 | Hara | 365/233 |
| 5,146,577 | 9/1992 | Babin | 365/189.12 X |
| 5,301,164 | 4/1994 | Miyawaki | 365/233 |

FOREIGN PATENT DOCUMENTS 404347934  12/1992  Japan ................................. 327/392

*Primary Examiner*—David C. Nelms
*Assistant Examiner*—Son Mai

[57] ABSTRACT

The logic circuit area 20 of, for example, a memory card, is equipped with an enable signal conversion circuit 22 which, based on the external enable signal CE(bar), generates the internal enable timing signal CEX for supplying the timing for the internal enable signals, MCE0(bar) through MCE7(bar), to be applied to the semiconductor memory. Even when the address signal changes randomly and the card enable signal CE (bar) repeatedly changes between high and low levels, an internal enable signal CEX which continues to be active is sent out, thus maintaining the internal enable signals MCE0(bar) through MCE7(bar) in the active state without any high-low changes. As a result, it becomes possible to control the pass-through current, etc. and to minimize the current consumption of the semiconductor memory area 10.

12 Claims, 5 Drawing Sheets

SEMICONDUCTOR MEMORY DEVICE WITH ENABLE SIGNAL CONVERSION CIRCUIT OPERATIVE FOR REDUCING CURRENT CONSUMPTION

FIELD OF TECHNOLOGY

The invention relates to a semiconductor memory device, such as a memory card that includes on-board semiconductor memory components, and more particularly, to an enable signal conversion circuit that converts an external enable signal coming in from outside, into an internal enable signal for the semiconductor memory component.

BACKGROUND TECHNOLOGY

In general, as shown in Drawing 7, a memory card 1 consists of one or two semiconductor memory areas (e.g., SRAM) 2 into which information can be written or from which information can be read, and a logic circuit 3 equipped with buffers 3a, 3b, and 3c. These buffers transfer to the semiconductor memory area 2, the address signal A coming from an external element such as a computer, the card enable signal CE, and the read/write signal RW. A data signal D is transferred directly either into or out of the semiconductor memory area 2 without going through a buffer. When the address signal A comes in from outside and is supplied to the semiconductor memory 2 via buffer 3a, the card enable signal CE, which is active within the same machine cycle, comes in and is supplied to the semiconductor memory area 2 via buffer 3b, activating the semiconductor memory area 2. Then, depending on the status of the read/write signal RW, the data signal D is either written into or read from the semiconductor memory area 2. However, this memory card configuration suffers from the problems described below.

In this configuration, the card enable signal CE from outside is applied without any change to the semiconductor memory area 2 via buffer 3b. However, when the semiconductor memory area 2 is accessed according to ascending or descending addresses, that is, when the address signal A changes randomly, the card enable signal CE supplied from an external computer also alternates between an active and inactive state every time the address signal A changes (for each continuous machine cycle). Consequently, the semiconductor memory area 2 alternates between the active and inactive states at a very high speed. When these transient changes in the semiconductor memory area 2 are severe, the pass-through current, etc. that flows through the internal circuit (consisting of a CMOS inverter, etc.) of the semiconductor memory area 2, becomes extremely high, thus inevitably resulting in a high level of current consumption by the semiconductor memory area 2. A more detailed explanation of this phenomenon follows. In general, when the enable signal CE of the semiconductor memory goes active, the level of current consumption increases over that experienced when the chip enable signal CE is inactive, due to the current that flows in the sense amplifier, etc. of the data line. Furthermore, the repeated alternation of the enable signal CE between the active and inactive states actually increases the pass-through current inside the CMOS circuit and the charging/discharging current, due to the wire capacitance. Whether the increase in current caused by the active state of the enable signal CE is larger or smaller than the increase caused by the repeated alternation of the enable signal CE between the active and inactive states, mainly depends on the circuit configuration of individual semiconductor memory components.

When an individual address signal is connected to both the enable signal CE, and an AND gate inside a semiconductor memory component and the address signal is incremented by +1 while the enable signal CE remains active, a minimum number of address signals are changed. On the other hand, when the enable signal CE repeatedly alternates between the active and inactive states, many address signals are internally changed at the point when the enable signal CE changes from the inactive state to the active state. This phenomenon increases the pass-through current inside the CMOS circuit and the charging/discharging current, due to the wire capacitance. In internally synchronized memory components that possess a so-called address transition detector (ATD) inside the semiconductor memory, repeated alternation of the enable signal CE between the active and inactive states changes many addresses, and also increases the pass-through current in the ATD and the charging/discharging current, due to the wire capacitance. Therefore, repeated alternation of the enable signal CE between the active and inactive states increases the pass-through current, etc. to an extremely high level inside the semiconductor memory, thus increasing current consumption. This level of power consumption shortens the battery life in battery-driven memory cards, and is thus unfit for actual applications in some cases.

Taking the above-mentioned problems into consideration, the objective of this invention is to provide a semiconductor memory device that reduces the current consumption of the semiconductor memory area, when the address signal changes randomly, by reducing the frequency at which the enable signal, which is applied to the semiconductor memory area, alternates between high and low.

DISCLOSURE OF THE INVENTION

In order to solve the above-mentioned problems in a semiconductor memory device possessing an enable signal conversion circuit that converts an external enable signal coming in from outside into an internal enable signal to be applied to the semiconductor memory area, the invention utilizes an active state maintenance apparatus as the above-mentioned enable signal conversion circuit. This active state maintenance apparatus maintains the internal enable signal in the active state for a specified period of time even after the external enable signal returns from the active to the inactive state. An example of this active state maintenance apparatus is a timing circuit that consists of both an integrating circuit that integrates the external enable signal, and a discharge circuit that discharges the above-mentioned integrating circuit when the external enable signal is in the active state. Another configuration example of an active state maintenance apparatus is a pulse-culling circuit that generates the internal enable signal by culling from the continuous pulses of the external enable signal. Yet another configuration example of an active state maintenance apparatus is a delay circuit that generates the internal enable signal by delaying the external enable signal for a specified period of time.

In a semiconductor memory device equipped with the above-mentioned active state maintenance apparatus, it is possible to adopt a configuration in which an active timing control apparatus is provided for selecting the duration for maintaining the active state.

Because the active state maintenance apparatus is installed as the enable signal conversion circuit as described above, the active maintenance status apparatus can transmit an internal enable signal that continues to be active even when the external enable signal repeatedly changes between high and low levels for contiguous machine cycles. Because the semiconductor memory area can be kept active, both the pass-through current and the charge/discharge current, etc. of the internal circuit can be controlled, thus making it possible to reduce current consumption, even when the address signal changes randomly.

When the active state maintenance apparatus is a timing circuit consisting of an integrating circuit that integrates the external enable signal, and a discharge circuit that discharges the integrating circuit when the external enable signal is active, the integrating circuit delays the return of the internal enable signal to the inactive state. Consequently, when the external enable signal goes active in the succeeding machine cycle, the internal enable signal will remain active without returning to the inactive state. When the external enable signal continuously changes between the active and the inactive states, the internal enable signal will remain active without following these changes. Consequently, the repeated change between the active and the inactive states is nearly eliminated from the semiconductor memory area, thus reducing its power consumption.

Installation of an active period control apparatus, in addition to the active state maintenance apparatus, makes it possible to control the frequency of high-low changes in the internal enable signal or the duration of its active state. Consequently, it becomes possible to adjust the duration of the active state according to the system configuration, and to minimize its power consumption.

BRIEF EXPLANATION OF THE DRAWINGS

Drawing 1 is a block diagram showing the overall configuration of a memory card related to a working example of the invention.

Drawing 2 is a circuit diagram showing the details of the logic circuit of said working example.

Figure 1:
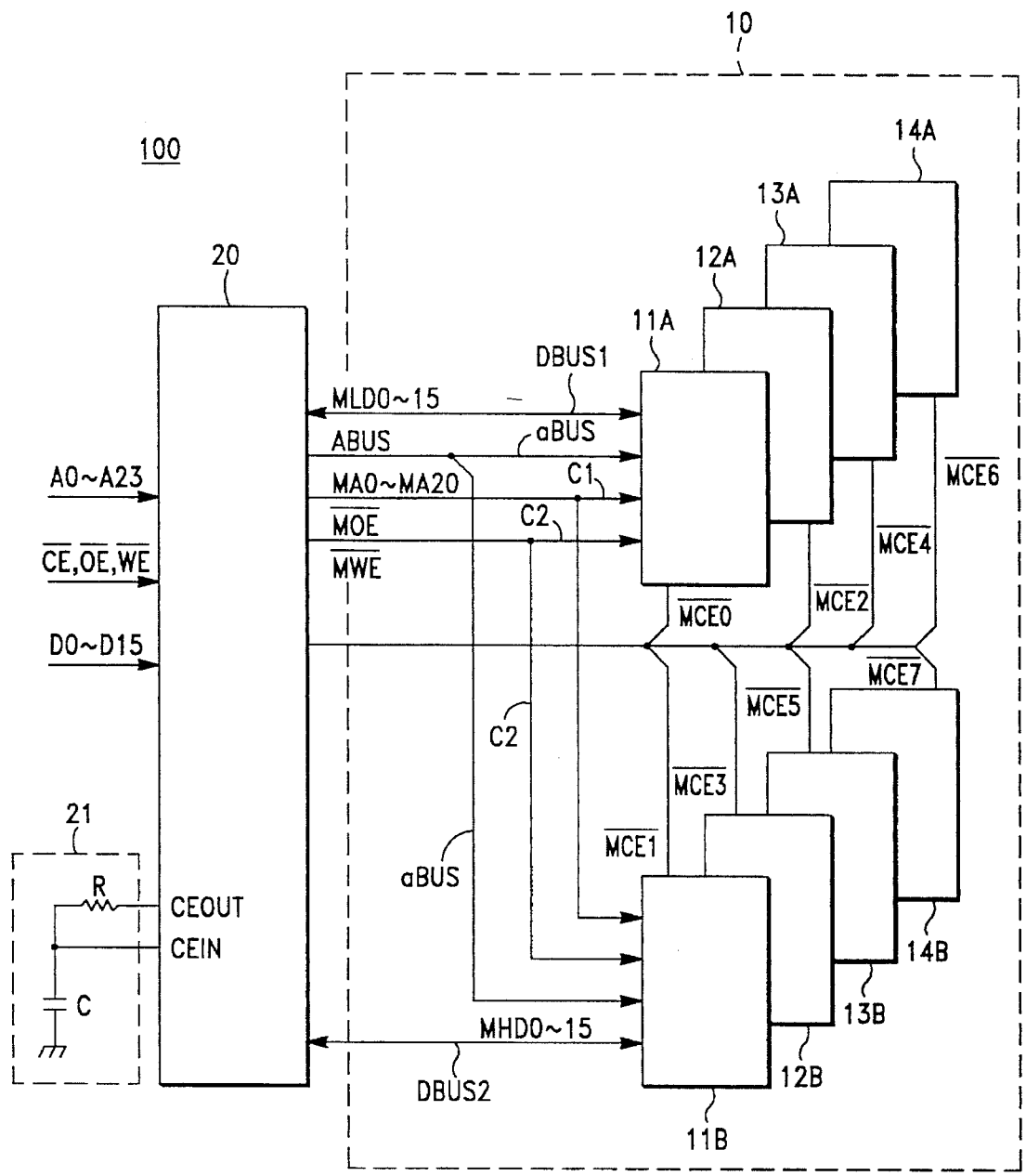
Figure 2:
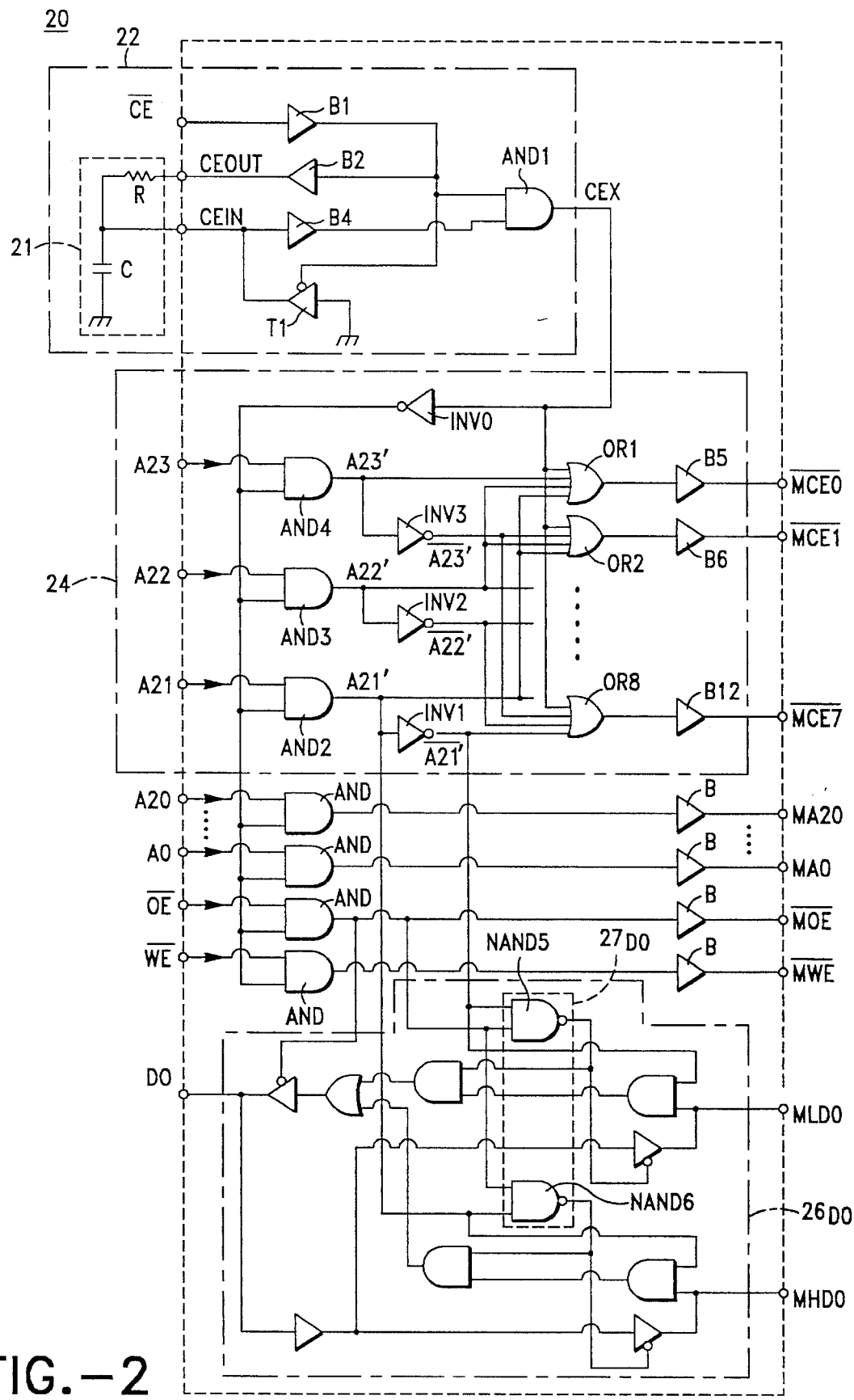
Figure 3:
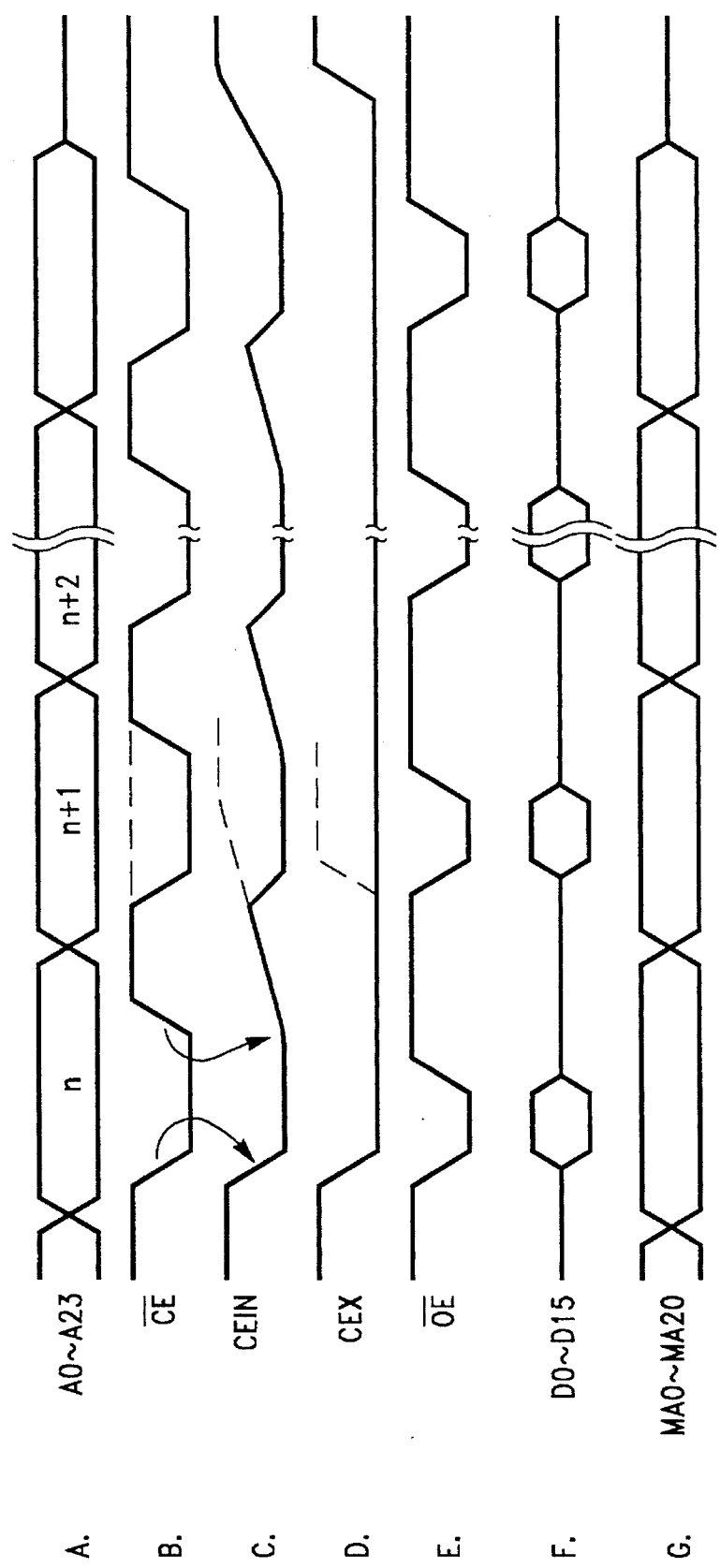
Figure 4:
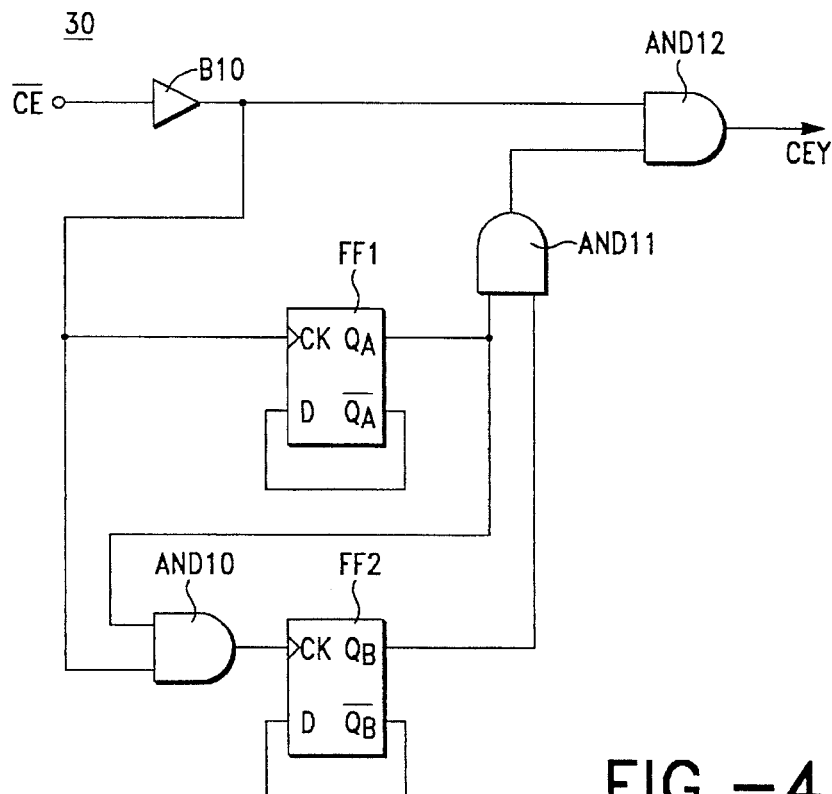
Figure 5:
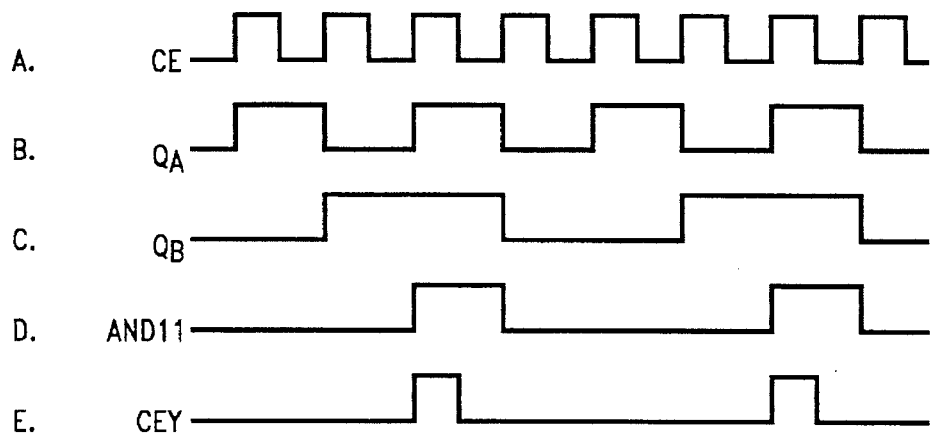
Figure 6:
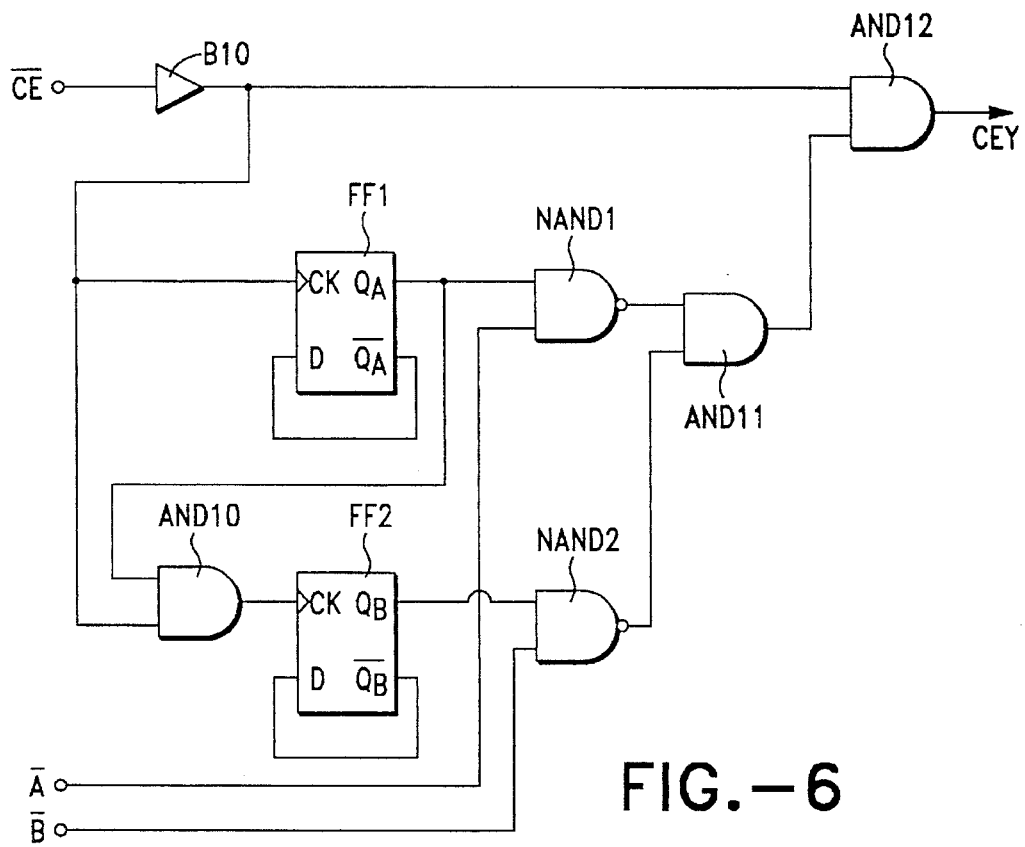
Figure 7:
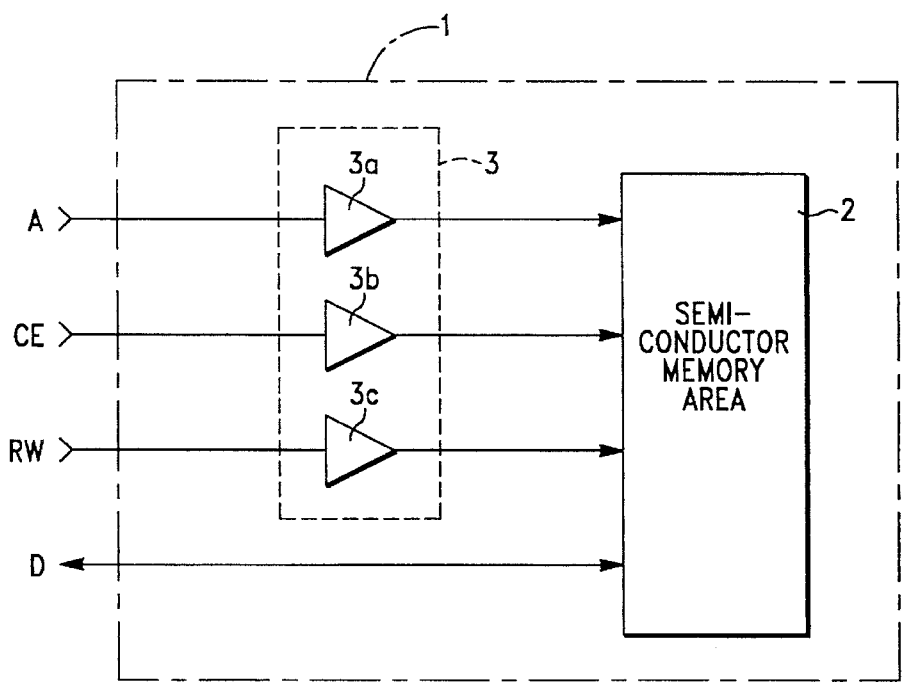

Drawing 3 is a timing chart for explaining the operation of said working example.

Drawing 4 is a block diagram showing another circuit configuration of the enable signal conversion circuit of said working example.

Drawing 5 is a timing chart for explaining the operation of the enable signal conversion circuit of Drawing 4.

Drawing 6 is a block diagram showing yet another circuit configuration of the enable signal conversion circuit of said working example.

Drawing 7 is a block diagram showing the circuit configuration of a conventional memory card.

IDEAL METHOD FOR IMPLEMENTING THE INVENTION

The working examples of the invention are explained in detail below, with reference to the attached drawings.

Drawing 1 is a block diagram showing the overall configuration of a memory card related to a working example of the invention. The memory card 100 of the working example consists of the following: a semiconductor memory area 10 that consists of multiple semiconductor memory devices (ICs) that can be used for the writing and reading of information; and a logic circuit area 20 that receives from the outside, control signals, such as address signals A0 through A23, data signals D0 through D15, the card enable signal CE(bar), the output enable signal OE(bar), and the write enable signal WE(bar), and sends them to the above-mentioned semiconductor memory area 10. The logic circuit area 20 is equipped with a timing setting circuit 21, an integrating circuit which is externally added to the IC. The semiconductor memory area 10 of this working example is divided into two blocks; block A which consists of semiconductor memory devices (SRAMs) 11A through 14A, and block B which consists of semiconductor memory devices (SRAMs) 11B through 14B. The logic circuit area 20 is connected to each of the semiconductor memory ICs of blocks A and B via the main address bus (ABUS) and the eight branch address buses (aBUS) which branch out from ABUS. The internal address signals MA0 through MA20 are supplied simultaneously to all of the semiconductor memory devices in parallel. The internal output enable signal MOE(bar) and the internal write enable signal MWE(bar) are supplied from the logic circuit area 20 to each of the semiconductor memory devices via the branched parallel control lines C1 and C2. On the other hand, the internal enable signals MCE0(bar) through MCE7(bar) are supplied to the corresponding semiconductor memory devices 11A through 14A, and 11B through 14B, via dedicated lines. In other words, signal MCE0(bar) is supplied to semiconductor memory device 11A; signal MCE1(bar) is supplied to semiconductor memory device 11B; signal MCE2(bar) is supplied to semiconductor memory device 12A; signal MCE3(bar) is supplied to semiconductor memory device 12B; signal MCE4(bar) is supplied to semiconductor memory device 13A; signal MCE5(bar) is supplied to semiconductor memory device 13B; signal MCE6(bar) is supplied to semiconductor memory device 14A; signal MCE7(bar) is supplied to semiconductor memory device 14B. Two independent systems of data buses are provided between the logic circuit area 20 and the semiconductor memory area 10 in this working example. Data signals MLD0 through MLD15 are supplied to the semiconductor memory devices in block A via the first data bus, DBUS1. Data signals MHD0 through MHD15 are supplied to the semiconductor memory devices in block B via the second data bus, DBUS2.

Drawing 2 is a circuit diagram showing the details of the logic circuit 20. The logic circuit area 20 consists of the following: the enable signal conversion circuit 22 which converts the incoming card enable signal CE(bar) to the enable timing signal CEX; the decoder 24 which generates the internal enable signals MCE0(bar) through MCE7(bar) by decoding the upper three bits A21 through A23 of the address signals A0 through A23 at the time the above-mentioned internal enable timing signal CEX is generated; the AND gates which add address signals A0 through A20, the output enable signals OE(bar), and the write enable signal WE(bar) at the time the above-mentioned internal enable timing signal CEX is generated, and which send out internal address signals MA0 through MA20, the internal output enable signals MOE(bar), the internal write enable signal MWE(bar); and input/output circuits $26_{D0}$ through $26_{D15}$ which transfer, in both directions, data signals D0 through D15 between buffer circuit B and the outside, as well as the two systems of internal data signals MLD0 through MLD15, and MHD0 through MHD15, which are transferred between buffer circuit B and the semiconductor memory area 10. Note that input/output circuits $26_{D1}$ through $26_{D15}$ are not shown in Drawing 2 since their configuration is the same as that of $26_{D0}$.

The enable signal conversion circuit 22 consists of the following: a timing setting circuit 21, which is an integrating circuit consisting of a resistor R and a capacitor C, and which uses the card enable signal CE(bar) via buffers B1 and B2; a transmission gate T1 which discharges capacitor C of the timing setting circuit 21 using the receipt of the card enable signal CE(bar) as a trigger; and a logical AND gate, AND1, which outputs the internal enable timing signal CEX, by using the signal that results when the card enable signal CE(bar) and the integrated output of the timing setting circuit 21 pass through buffer B4.

The decoder 24 generates eight types of internal enable signals MCE0(bar) through MCE7(bar) based on the three-bit address signals A21 through A23 at the time the internal enable timing signal CEX is generated, and consists of the following: an inverter INV0 which obtains the inverted signal of the internal enable timing signal CEX; logical AND gates AND2 through AND4, which generate three types of signals, A21' through A23', by combining address signals A21 through A23 with the internal enable timing signal CEX; inverters INV1 through INV3, which generate the inverted signals of A21' through A23', which are A21'(bar) through A23'(bar); logical OR gates, OR1 through OR8, which generate the internal enable signals MCE0(bar) through MCE7(bar), by combining signals A21' through A23' with their inverted signals, A21'(bar) through A23'(bar); and buffers B5 through B12.

Input/output circuit $26_{D0}$ is based on two ordinary I/O buffer circuits configured in parallel. This input/output circuit $26_{D0}$ consists of NAND gates, NAND 5 and 6, and an internal data bus switching control circuit $27_{D0}$ which switches exclusively between the input/output of data signal DO and internal data signal MLD0, or between the input/output of data signal DO and internal data signal MHD0, depending on the level of address signal A21. In other words, when the semiconductor memory devices 11A through 14A of block A have been selected, data signals MLD0 through MLD15 are written or read via the first data bus DBUS1, and when the semiconductor memory devices 11B through 14B of block B have been selected, data signals MHD0 through MHD15 are written or read via the second data bus DBUS2. The first and the second data buses have been installed separately via I/O circuits for the following reason. Generally speaking, when the number of semiconductor memory ICs connected in parallel to a data bus increases, their pin capacity (wiring capacitance) also increases. Since data signals, like clock signals, change between high and low levels at very high speeds, the amount of pin capacity charge/discharge increases, resulting in an abrupt rise in the operating current of the data signals. Therefore, in this working example, pin capacity was reduced by half in order to reduce the operating current and to lengthen the life of the battery power supply. This was accomplished by installing data bus line DBUS1 dedicated for block A, and data bus line DBUS2 dedicated for block B, between data input/output circuit $26_{D0}$ and the semiconductor memory area 10.

The operation of the working example is explained with reference to the timing diagram in Drawing 3.

As shown in Drawing 3, when address signals A0 through A23 enter the logic circuit area 20 from outside (external computer, etc.) during machine cycle n, the active (low level) card enable signal CE(bar) also enters the logic circuit area 20 from outside at the same time. In other words, when this card enable signal CE(bar) goes low, transmission gate T1 of the enable signal conversion circuit 22 goes on, grounding the enable input pin CEIN. As a result, capacitor C of the timing setting circuit 21 is discharged. Since both inputs of the logical AND gate AND1 are low in this case, the output of AND1, i.e., the internal enable timing signal CEX, is also low. When the card enable signal CE(bar) returns from the active state to the inactive state within machine cycle n, the transmission gate T1 goes off, disconnecting the enable input pin CEIN from the ground. Simultaneously with this event, the card enable signal CE(bar) at the high level is supplied, via buffers B1 and B2, to the card enable output pin CEOUT of the timing setting circuit 21. Consequently, the integral waveform of this card enable signal CE(bar) appears on the card enable output pin CEIN. This integral waveform possesses gradually-increasing potential, and its time constant is the product of the resistance of the resistor R multiplied by the capacitance of the capacitor C. This time constant is used as a guideline in estimating the delay time during the rise of the potential. Even when the card enable signal CE(bar) rises, the integral potential that appears on the card enable output pin CEIN rises slowly; thus, the integral potential which appears on the enable output pin CEIN will not exceed the threshold value of the logical AND gate AND1, when the card enable signal CE(bar) goes active again in the next machine cycle (n+1). Consequently, the internal enable timing signal CEX will remain low without returning to a high level. When the card enable signal CE(bar) remains inactive during machine cycle (n+1) as indicated by the dotted line in the timing diagram, the integral potential which appears on the enable output pin CEIN will continue rising, exceeding the threshold value of the logical AND gate AND1. In this case, the internal enable timing signal CEX will return to a high level. As explained above, in this working example, when the card enable signal CE(bar) repeatedly changes between high (inactive) and low (active) levels during continuous machine cycles, an internal enable timing signal CEX that is continuously active will be sent out from the enable signal conversion circuit 22. Since this internal enable timing signal CEX determines the timing of the internal enable signals, MCE0(bar) through MCE7(bar) in the decoder 24, selected semiconductor memory ICs will continue to be active. Therefore, even when the address signal changes randomly, the internal enable signal can be maintained in the active state by eliminating high-low changes. As a result, it becomes possible to control the pass-through current, etc. and to minimize the current consumption of the semiconductor memory area 20.

When a mask ROM card possessing memory capacity of 12 M bytes (2-M byte ROM×6) was actually used, with a cycle time of 200 nsec (address cycle) and the waveform in the timing diagram of Drawing 3, the average current consumption of the card declined from 70 to 50 mA, indicating a 30% reduction. Naturally, this effect also depends on cycle time, and the shorter the cycle becomes, the more noticeable the effect.

Drawing 4 is a block diagram showing another configuration of the enable signal conversion circuit of said working example. This enable signal conversion circuit 30 outputs the internal enable timing signal CEY by culling the pulses of the enable signal CE(bar). The enable signal CE(bar) is supplied, via buffer B10, to the clock pin CK of the first D flip-flop FF1, as well as to one of the input pins of the logical AND gates, AND10 and AND12. The $Q_A$(bar) output of the first D flip-flop FF1 is fed back to data pin D, and $Q_A$ output is applied to one of the input pins of the logical AND gate AND11 and to the remaining input pin of the logical AND gate AND10. The output of the logical AND gate AND10 is then supplied to the clock pin CK of the second D flip-flop FF2. The $Q_B$(bar) output of the second D flip-flop FF2 is fed back to data pin D, and the $Q_B$ output is applied to the remaining input pin of the logical AND gate AND11. The output of the logical AND gate AND11 is applied to the remaining input pin of the logical AND gate AND12. In this type of circuit configuration, when the enable signal CE repeatedly changes to the active state during continuous machine cycles as shown in Drawing 5, the internal enable timing signal CEY, output by the logical AND gate 12, possesses a waveform consisting of the enable signal CE(bar) minus two or three pulses. This is because the first D flip-flop FF1 is a binary counter and the second D flip-flop FF2 and the logical AND gate AND10 are synchronous counters. The period during which the internal enable timing signal CEY stays low is longer than that during which the enable signal CE(bar) stays low, reducing the frequency of the high-low changes. Therefore, even when a rapidly changing enable signal CE(bar) comes in, it is possible to control the pass-through current and minimize current consumption, because the internal enable timing signal CEY changes between high and low at a slow speed.

Drawing 6 is a block diagram showing yet another circuit configuration of the enable signal conversion circuit of said working example. In this enable signal conversion circuit, NAND gates NAND1 and 2 have been added to the circuit shown in Drawing 4. In this circuit, active period control signals A(bar) and B(bar) are connected along with flip-flop outputs $Q_A$ and $Q_B$ to NAND gates NAND1 and 2. For example, when the active period control signals A(bar) and B(bar) are at high and low levels, respectively, the output of NAND gate NAND2 becomes high, and the output of NAND gate NAND1, i.e., the waveform of the flip-flop output $Q_A$, become valid. In this case, the internal enable timing signal CEY will possess a waveform with every other pulse removed from the enable signal CE(bar), thus reducing the frequency of the high-low changes by half. Conversely, when the active period control signals A(bar) and B(bar) are at low and high levels, respectively, the output of NAND gate NAND1 becomes high, and the output of NAND gate NAND2, i.e., the waveform of the flip-flop output $Q_B$, become valid. In this case, the internal enable timing signal CEY will possess a waveform that skips every third pulse of the enable signal CE(bar), thus reducing the high-low change frequency by half. When the active period control signals A(bar) and B(bar) are both at low level, the circuit configuration will be equivalent to that in Drawing 4, and the internal enable timing signal CEY will possess the waveform shown in Drawing 5. In this way, the frequency of the high-low changes or the duration of the active state of the internal enable timing signal can be controlled using the active period control signals A(bar) and B(bar). This ability to adjust the duration of the active time according to system configuration makes it possible to minimize power consumption.

In addition to the enable signal conversion circuit explained above, it is possible to use other configurations. For example, logic gates can be used to configure a multi-stage inverter for delaying the enable signal, as well as the logic of the delayed and the enable signals.

Although the above explanation of the invention used the example of a memory card, the application scope of the invention is not limited to memory cards, and can include memory boards with on-board semiconductor memory and internal circuits of semiconductor memory devices.

INDUSTRIAL FIELD OF APPLICATION

As explained above, the invention is characterized in that an active state maintenance apparatus is installed as an enable signal conversion circuit, and thus offers the following benefits.

(1) Even when the address signal changes randomly and the external enable signal repeatedly changes between high and low levels during continuous machine cycles, an internal enable signal that is maintained in the active state can be sent out, thus maintaining the semiconductor memory in the active state. As a result, it becomes possible to control the pass-through and charge/discharge currents of the internal circuit, and to minimize its current consumption.

(2) Installation of an active period control apparatus makes it possible to control the frequency of the high-low changes in the internal enable timing signal or the duration of its active state. Consequently, it becomes possible to adjust the duration of the active state according to the system configuration, and to minimize power consumption.

We claim:

1. In a semiconductor memory device having a semiconductor memory area containing memory cells, and an enable signal conversion circuit that converts an external enable signal delivered from outside said device into an internal enable timing signal for controlling internal enable signals to be applied to the semiconductor memory area, the enable signal conversion circuit causing the internal enable timing signal to be in an active state at all times when the external enable signal is in an active state, the improvement wherein said enable signal conversion circuit comprises an active state maintenance unit that maintains the internal enable signal in the active state for a specified period of time independently of a change in state of the external enable signal.

2. The semiconductor memory device defined in claim 1 wherein said active state maintenance unit comprises a timing circuit composed of both an integrating circuit that integrates the external enable signal, and a discharge circuit that discharges said integrating circuit when the external enable signal is in the active state.

3. The semiconductor memory device defined in claim 1 wherein said active state maintenance unit comprises a pulse-culling circuit that generates the internal enable timing signal by culling from continuous pulses of said external enable signal.

4. The semiconductor memory device defined in claim 1 wherein said active state maintenance unit comprises a delay circuit that generates the internal enable timing signal by delaying the external enable signal for a selected period of time.

5. The semiconductor memory device defined in claim 1 wherein said active state maintenance unit includes means for controlling the duration of the period of time during which the internal enable timing signal is maintained in the active state.

6. The semiconductor memory device defined in claim 2 wherein said active state maintenance unit includes means for controlling the duration of the period of time during which the internal enable timing signal is maintained in the active state.

7. The semiconductor memory device defined in claim 3 wherein said active state maintenance unit includes means for controlling the duration of the period of time during which the internal enable timing signal is maintained in the active state.

8. The semiconductor memory device defined in claim 4 wherein said active state maintenance unit includes means for controlling the duration of the period of time during which the internal enable timing signal is maintained in the active state.

9. In a semiconductor memory device having a semiconductor memory area containing memory cells, and an enable signal conversion circuit that converts an external enable signal delivered from outside said device into an internal enable timing signal for controlling internal enable signals to be applied to the semiconductor memory area, the enable signal conversion circuit causing the internal enable timing signal to be in an active state at all times when the external enable signal is in an active state, the external enable signal and the internal enable timing signal being switchable between an active state and an inactive state, the improvement wherein said enable signal conversion circuit comprises an active state maintenance unit that switches the internal enable timing signal to its active state in response to switching of the external enable signal to its active state, maintains the internal enable timing signal to remain in its active state for a specified period of time after switching of the external enable signal from its active state to its inactive state, and causes the internal enable timing signal to assume a state corresponding to the state of the external enable signal after the predetermined period of time.

10. The semiconductor memory device defined in claim 1, wherein said enable conversion circuit comprises:

an integrating circuit for inputting the external enable signal and outputting a signal which is a time integral of said external enable signal; and a gate circuit for switching the internal enable timing signal into an inactive state when the output from said integrating circuit reaches a specified value and the external enable signal is in an inactive state.

11. The semiconductor memory device as defined in claim 1, herein said enable conversion circuit comprises:

an external enable signal input terminal for inputting the external enable signal;

an external enable signal output terminal for outputting the external enable signal which has been inputted at said enable signal input terminal;

a resistor element having two ends, with one of its ends connected to said external enable signal output terminal;

a capacitance element being connected in between a connecting point at the other of the ends of said resistor element and a power supply terminal; and a gate circuit having a first input connected to receive a potential at the connecting point, a second input connected to receive the external enable signal, and an output for providing the internal enable timing signal, said gate circuit being operative for causing the internal enable timing signal to have an inactive state when the potential at the connecting point reaches a specified value and the external enable signal is in an inactive state.

12. The semiconductor memory device as defined in claim 11, wherein said enable conversion circuit further comprises a voltage applying circuit for applying a specified voltage to said capacitance element when the external enable signal is in its active state.

* * * * *